United States Patent
Motojima et al.

(10) Patent No.: US 9,601,987 B2
(45) Date of Patent: Mar. 21, 2017

(54) POWER SUPPLY APPARATUS

(71) Applicant: DENSO CORPORATION, Kariya, Aichi-pref. (JP)

(72) Inventors: Mutsuya Motojima, Kariya (JP); Takeshi Morinaga, Kariya (JP)

(73) Assignee: DENSO CORPORATION, Kariya (JP)

( * ) Notice: Subject to any disclaimer, the term of this patent is extended or adjusted under 35 U.S.C. 154(b) by 63 days.

(21) Appl. No.: 14/535,381

(22) Filed: Nov. 7, 2014

(65) Prior Publication Data

US 2015/0180326 A1   Jun. 25, 2015

(30) Foreign Application Priority Data

Dec. 25, 2013   (JP) ................. 2013-267041

(51) Int. Cl.
| | |
|---|---|
| G05F 1/00 | (2006.01) |
| H02M 1/32 | (2007.01) |
| H02M 3/156 | (2006.01) |
| G01R 19/00 | (2006.01) |
| G05F 1/575 | (2006.01) |
| G05F 1/618 | (2006.01) |

(52) U.S. Cl.
CPC .............. *H02M 1/32* (2013.01); *G01R 19/00* (2013.01); *G05F 1/575* (2013.01); *G05F 1/618* (2013.01); *H02M 3/1563* (2013.01)

(58) Field of Classification Search
CPC . G05F 1/575; G05F 1/56; G05F 1/573; G05F 3/30
USPC ......... 323/273, 274–276, 277–281, 312, 313
See application file for complete search history.

(56) References Cited

U.S. PATENT DOCUMENTS

| | | | |
|---|---|---|---|
| 7,402,987 B2* | 7/2008 | Lopata | G05F 1/575 323/280 |
| 2001/0017535 A1 | 8/2001 | Inaba et al. | |
| 2005/0189932 A1 | 9/2005 | Itoh | |
| 2013/0002216 A1* | 1/2013 | Kim | G05F 1/565 323/274 |

FOREIGN PATENT DOCUMENTS

| | | |
|---|---|---|
| JP | H11-099904 A | 4/1999 |
| JP | 2001-297954 A | 10/2001 |

(Continued)

OTHER PUBLICATIONS

Japanese Office Action mailed on Jan. 26, 2016 in the corresponding JP application No. 2013-267041 (English translation attached).

*Primary Examiner* — Nguyen Tran
(74) *Attorney, Agent, or Firm* — Posz Law Group, PLC

(57) ABSTRACT

In a power supply apparatus, power is transmitted from its input terminal to its output terminal. The transmitted power is controlled so that an output voltage detected in a predetermined ratio can be equal to a reference voltage. A reduction signal is outputted when the output voltage decreases below a threshold. A presence or absence of an abnormality in a capacitance connected to the output terminal or a load current in a load connected to the output terminal is determined, when the output voltage is equal to the target voltage, by changing at least one of the detection ratio and the reference voltage so that the output voltage can transition from a target voltage higher than the threshold toward a middle voltage lower than the threshold only during a predetermined time period.

5 Claims, 9 Drawing Sheets

(56) References Cited

FOREIGN PATENT DOCUMENTS

| | | | |
|---|---|---|---|
| JP | 2002-366238 | A | 12/2002 |
| JP | 2003-104165 | A | 4/2003 |
| JP | 2006-100509 | A | 4/2006 |
| JP | 2008-083850 | A | 4/2008 |
| JP | 2010-246294 | A | 10/2010 |

* cited by examiner

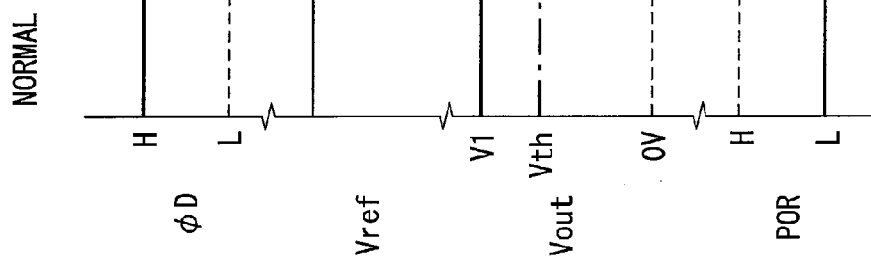
FIG. 4B NORMAL
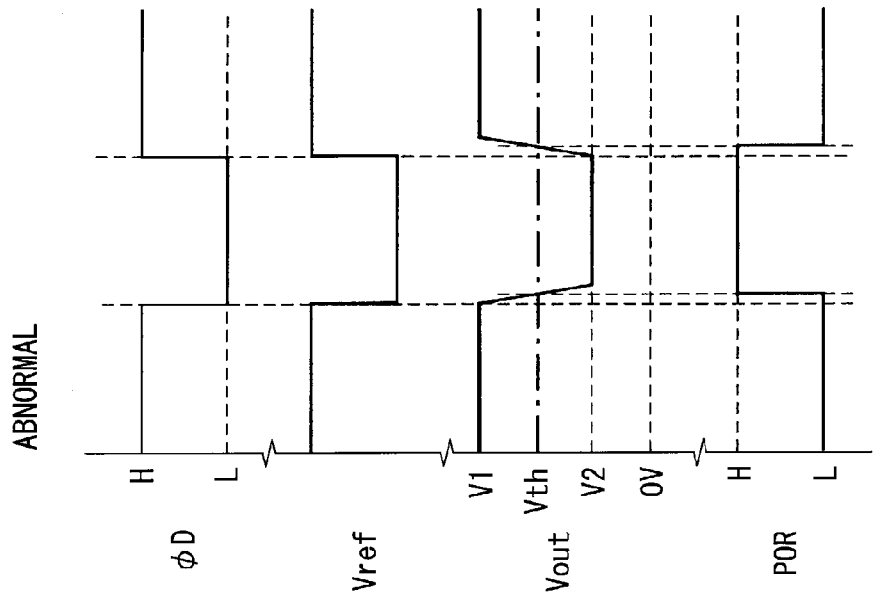
FIG. 4A ABNORMAL

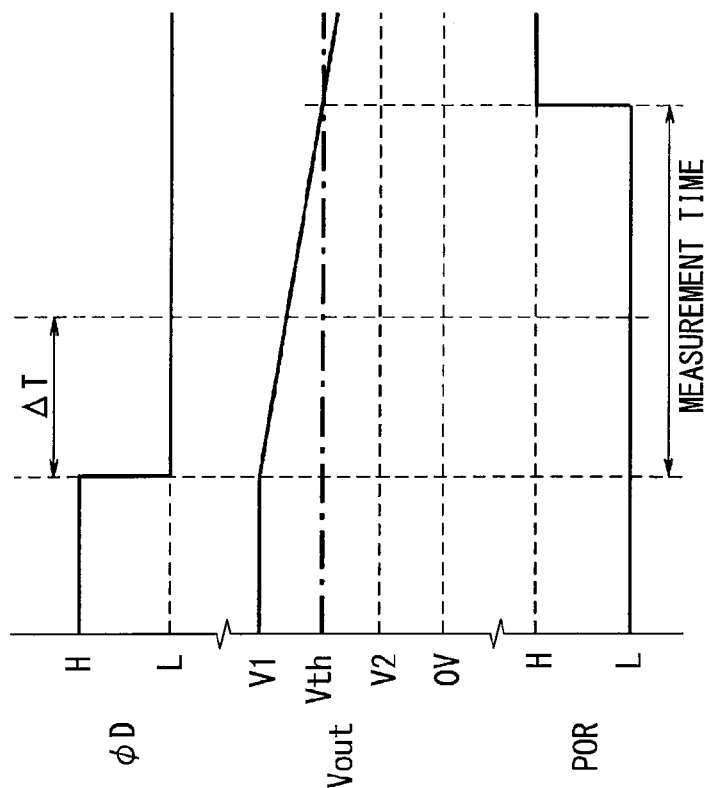
FIG. 6A ABNORMAL
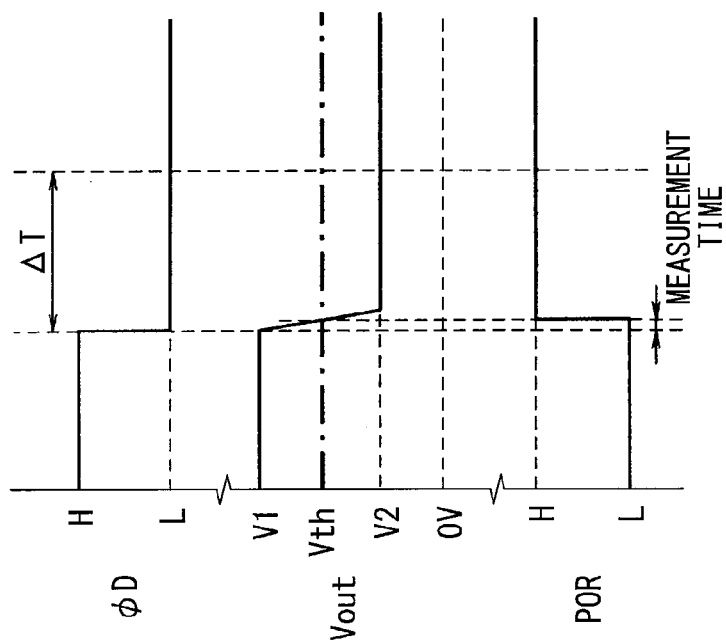
FIG. 6B NORMAL

POWER SUPPLY APPARATUS

CROSS REFERENCE TO RELATED APPLICATION

This application is based on and claims priority to Japanese Patent Application No. 2013-267041 filed on Dec. 25, 2013, the contents of which are incorporated herein by reference.

FIELD

The present invention relates to a power supply apparatus having a function to determine a presence or absence of an abnormality in a capacitance connected to its output terminal or a load current.

BACKGROUND

In general, a capacitor for smoothing an output voltage and a load such as an electronic control unit are connected between output terminals of a power supply apparatus. For example, if the capacitor becomes disconnected from the output terminals, or if a capacitance of the capacitor is smaller than a predetermined value, ripple components of the output voltage increase, so that operations of the electronic control unit may be affected. Further, if a failure occurs in the electronic control unit as a load, its consumption current (i.e., load current) may exceed a predetermined range.

JP-A-H11-99904 discloses a power supply apparatus including a voltage step-up power supply circuit to charge a capacitor by stepping up a battery voltage, a constant voltage power supply circuit to generate a constant voltage for control, and a series circuit of a switch circuit and a current detection resistor provided in an energization path from output terminals of the voltage step-up power supply circuit to input terminals of the constant voltage power supply circuit. In JP-A-H11-99904, a microcomputer calculates a capacitance of the capacitor based on a change in a voltage of a junction between the switch circuit and the current detection resistor by stopping operations of the voltage step-up power supply circuit after turning ON the switch circuit.

If operations of switching devices in a power supply circuit are stopped under conditions where a capacitor is disconnected from output terminals of the power supply circuit or if a capacitance of the capacitor is extremely smaller than a predetermined value, an output voltage may sharply decrease to 0V, so that a latch-up may occur. Further, if the output voltage sharply decreases to 0V, a delay may occur in an output of a monitor circuit such as a power-on reset circuit. As a result, a puppy supply to a load may be stopped without a voltage reduction signal being outputted. In this case, register values and data values in the load cannot be saved.

SUMMARY

In view of the above, it is an object of the present disclosure to provide a power supply apparatus capable of determining a presence or absence of an abnormality in a capacitance connected to its output terminal or a load current without affecting normal operations of a load.

According to a first aspect of the present disclosure, a power supply apparatus includes an input terminal adapted to be connected to an input power source, an output terminal adapted to be connected to a load, a power transmission circuit configured to transmit electric power in a direction from the input terminal to the output terminal and capable of adjusting the transmitted power, a detection circuit configured to detect an output voltage of the output terminal in a predetermined detection ratio, a reference voltage generation circuit configured to generate a reference voltage, a control circuit configured to control the transmitted power so that the voltage detected by the detection circuit can be equal to the reference voltage, a monitor circuit configured to output a voltage reduction signal when the output voltage decreases below a predetermined threshold voltage, a change circuit configured to change at least one of the detection ratio and the reference voltage so that the output voltage can transition between a target voltage higher than the threshold voltage and a middle voltage lower than the threshold voltage, and a determination circuit configured to perform an abnormality determination process, when the output voltage is equal to the target voltage, by supplying a change command to the change circuit.

The change circuit changes at least one of the detection ratio and the reference voltage in response to the change command so that the output voltage can transition from the target voltage toward the middle voltage only during a predetermined time period. When the monitor circuit outputs the voltage reduction signal according to the abnormality determination process, the determination circuit determines that a capacitance connected to the output terminal or a load current flowing through the load is abnormal. The time period is given by $K \cdot (CL \cdot \Delta V/IL)$, where K is a positive coefficient less than one, CL is a predetermined value of the capacitance, IL is a predetermined value of the load current, and $\Delta V$ is a difference between the target voltage and the threshold voltage.

According to a second aspect of the present disclosure, a power supply apparatus includes an input terminal adapted to be connected to an input power source, an output terminal adapted to be connected to a load, a power transmission circuit configured to transmit electric power in a direction from the input terminal to the output terminal and capable of adjusting the transmitted power, a detection circuit configured to detect an output voltage of the output terminal in a predetermined detection ratio, a reference voltage generation circuit configured to generate a reference voltage, a control circuit configured to control the transmitted power so that the voltage detected by the detection circuit can be equal to the reference voltage, a monitor circuit configured to output a voltage reduction signal when the output voltage decreases below a predetermined threshold voltage, a change circuit configured to change at least one of the detection ratio and the reference voltage so that the output voltage can transition between a target voltage higher than the threshold voltage and a middle voltage lower than the threshold voltage, a determination circuit configured to perform an abnormality determination process, when the output voltage is equal to the target voltage, by supplying a change command to the change circuit, and a measurement circuit configured to measure a time elapsed from when the determination circuit supplies the change command to the change circuit to when the monitor circuit outputs the voltage reduction signal.

The change circuit changes at least one of the detection ratio and the reference voltage in response to the change command so that the output voltage can transition from the target voltage toward the middle voltage. When the time measured by the measurement circuit is less than a predetermined time period, the determination circuit determines that a capacitance connected to the output terminal or a load current flowing through the load is abnormal. The time period is given by K·(CL·ΔV/IL), where K is a positive coefficient less than one, CL is a predetermined value of the capacitance, IL is a predetermined value of the load current, and ΔV is a difference between the target voltage and the threshold voltage.

BRIEF DESCRIPTION OF THE DRAWINGS

The above and other objects, features and advantages of the present disclosure will become more apparent from the following detailed description made with reference to the accompanying drawings. In the drawings:

FIG. 4A is a timing diagram of the power supply circuit of FIG. 3 in an abnormal condition, and FIG. 4B is a timing diagram of the power supply circuit of FIG. 3 in a normal condition;

FIG. 6A is a timing diagram of the power supply circuit of FIG. 5 in an abnormal condition, and FIG. 6B is a timing diagram of the power supply circuit of FIG. 5 in a normal condition;

DETAILED DESCRIPTION

Embodiments of the present disclosure are described below with reference to the drawings in which like characters of reference indicate the same or equivalent parts.

First Embodiment

Figure 1:
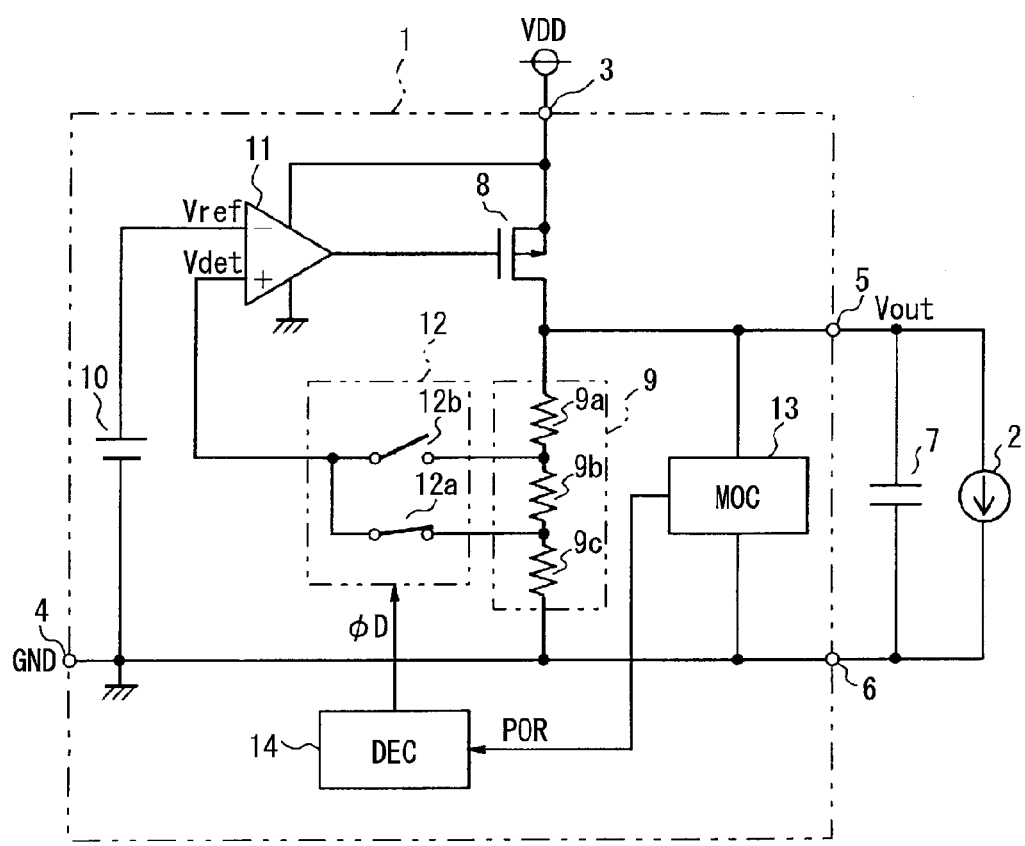
FIG. 1 is a diagram illustrating a power supply circuit according to a first embodiment of the present disclosure.

A power supply circuit 1 according to a first embodiment of the present disclosure is described with reference to FIG. 1 and FIGS. 2A and 2B. The power supply circuit 1 is formed as a power source for a load 2 in an integrated circuit (IC). The load 2 can be either an analog circuit or a digital circuit. Examples of the load 2 can include an amplifier circuit, a signal processing circuit, etc. The power supply circuit 1 is supplied with an input voltage VDD (e.g., 5V) from an input power source connected through input nodes 3 and 4 and supplies a constant output voltage Vout (e.g., 3.3V) to the load 2 through output nodes 5 and 6. A capacitor 7 is connected between the output nodes 5 and 6 to smooth the output voltage Vout. As shown in FIG. 1, the load 2 can be equivalently expressed as a constant current source that produces a load current.

The power supply circuit 1 is configured as a series regulator and includes a P-channel MOS transistor 8, a voltage detection circuit 9, a reference voltage source 10, and an operational amplifier 11. The voltage detection circuit 9 outputs a detection voltage Vdet by dividing the output voltage Vout in a divisional ratio. The reference voltage source 10 generates a reference voltage Vref. The MOS transistor 8 serves as a power transmission circuit to transmit electric power in a direction from the input node 3 to the output node 5 while adjusting the transmitted power according to its gate voltage. The voltage detection circuit 9 is configured as a series circuit of resistors 9a, 9b, and 9c. The reference voltage source 10 corresponds to a reference voltage generation circuit recited in claims. The operational amplifier 11 controls the gate voltage of the MOS transistor 8 so that the detection voltage Vdet can be equal to the reference voltage Vref.

The power supply circuit 1 includes a change circuit 12, a monitor circuit 13, and a determination circuit 14 which are used to determine a presence or absence of an abnormality in a capacitance of the capacitor 7 or the load current. The change circuit 12 changes the divisional ratio of the voltage detection circuit 9. The monitor circuit 13 monitors a reduction in the output voltage Vout. The change circuit 12 changes the divisional ratio (i.e., detection ratio) of the voltage detection circuit 9 so that the output voltage Vout can transition between a target voltage V1 higher than a threshold voltage Vth and a middle voltage V2 lower than the threshold voltage Vth. The middle voltage V2 is higher than 0V.

Specifically, the change circuit 12 includes switches 12a and 12b. The switch 12a is connected between a junction between the resistors 9b and 9c and a non-inverting input terminal of the operational amplifier 11. The switch 12b is connected between a junction between the resistors 9a and 9b and the non-inverting input terminal of the operational amplifier 11. The switches 12a and 12b are complementarily turned ON and OFF. When a switch signal φD outputted from the determination circuit 14 is at a high (H) level, the switch 12a is turned ON, and the switch 12b is turned OFF. In contrast, when the switch signal φD is at a low (L) level, the switch 12a is turned OFF, and the switch 12b is turned ON.

The monitor circuit 13 outputs a voltage reduction signal POR of a low level when the output voltage Vout is not less than the threshold voltage Vth. In contrast, the monitor circuit 13 outputs the voltage reduction signal POR of a high level when the output voltage Vout is less than the threshold voltage Vth. A voltage reduction signal recited in claims corresponds to the voltage reduction signal POR of the high level. For example, the monitor circuit 13 can be configured as a power-on-reset circuit. The determination circuit 14 performs a determination process to determine a presence or absence of an abnormality in the capacitance or the load current, for example, upon application of the input voltage VDD to the IC, upon reception of a self-check command from an electronic control unit (not shown), etc.

Next, effects of the first embodiment are described with reference to FIGS. 2A and 2B. When the capacitor 7 is correctly formed, its capacitance is equal to a known, predetermined value CL. Further, when the load 2 is correctly formed and also correctly operates, the load current which the power supply circuit 1 supplies to the load 2 is equal to a known, predetermined value IL. These values CL and IL are representative values. In practice, the capacitance varies over a predetermined range including the predetermined value CL depending on circuit constant variations and circuit operating conditions, and the load current varies over a predetermined range including the predetermined value IL depending on circuit constant variations and circuit operating conditions.

The determination circuit 14 keeps the switch signal φD at the high level when not performing a self-check procedure. At this time, the switch 12a is ON, and the switch 12b is OFF. The operational amplifier 11 controls the gate voltage so that the output voltage Vout can be equal to the target voltage V1 higher than the threshold voltage Vth.

The determination circuit 14 starts the self-check procedure when the output voltage Vout is stabilized to the target voltage V1. As shown in FIGS. 2A and 2B, the determination circuit 14 changes the switch signal φD supplied to the change circuit 12 from the high level to the low level and keeps the switch signal φD at the low level only for a time period ΔT. Accordingly, during the time period ΔT, the switch 12a is OFF, and the switch 12b is ON. The operational amplifier 11 keeps the MOS transistor 8 OFF during a time period where the output voltage Vout is higher than the middle voltage V2.

Thus, when the self-check procedure is started, the output voltage Vout decreases toward the middle voltage V2 lower than the threshold voltage Vth. Then, when the output voltage Vout decreases to near the middle voltage V2, the operational amplifier 11 controls the gate voltage so that the output voltage Vout can be equal to the middle voltage V2. Then, when the determination circuit 14 changes the switch signal φD back to the high level after the elapse of the time period ΔT, the operational amplifier 11 controls the gate voltage so that the output voltage Vout can be equal to the target voltage V1.

Figure 2B:
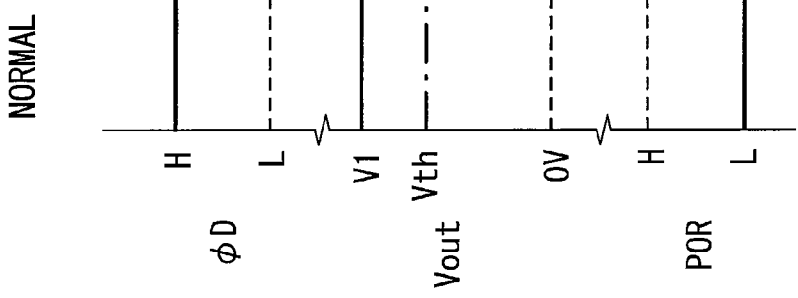
FIG. 2B is a timing diagram of the power supply circuit of FIG. 1 in a normal condition.
Figure 2A:
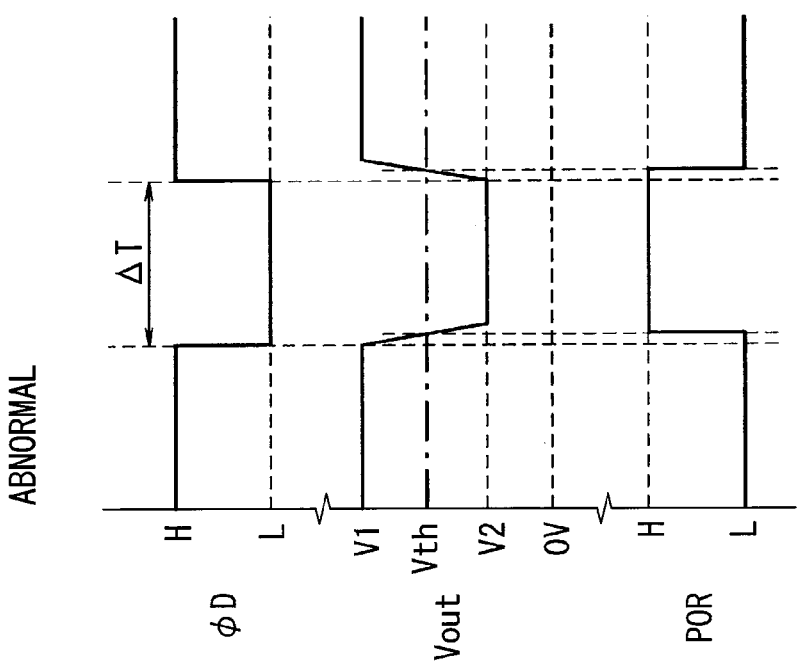
FIG. 2A is a timing diagram of the power supply circuit of FIG. 1 in an abnormal condition.

FIG. 2A shows waveforms under abnormal conditions such as when the capacitor 7 is not connected between the output nodes 5 and 6, when the capacitance of the capacitor 7 is extremely smaller than the predetermined value CL, and when the load current is extremely larger than the predetermined value IL. In contrast, FIG. 2B shows waveforms under a normal condition where the capacitance of the capacitor 7 and the load current fall within their respective ranges.

When the capacitance or the load current is in the abnormal conditions, the output voltage Vout decreases below the threshold voltage Vth within the time period ΔT, and therefore the monitor circuit 13 outputs the voltage reduction signal POR of the high level. In contrast, when both the capacitance and the load current are in the normal condition, the output voltage Vout does not decrease to the threshold voltage Vth within the time period ΔT, and therefore the monitor circuit 13 keeps the voltage reduction signal POR at the low level. In this way, the determination circuit 14 can determine a presence or absence of an abnormality in the capacitance and the load current based on the voltage reduction signal POR within the time period ΔT.

The time period ΔT is set so that the determination circuit 14 can suitably determine a presence or absence of an abnormality. Since the MOS transistor 8 is turned OFF upon a change of the switch signal φD from the high level to the low level, the output voltage Vout decreases at a rate which depends on the capacitance of the capacitor 7 and the load current. Assuming that the capacitance of the capacitor 7 is equal to the predetermined value CL and that the load current is equal to the predetermined value IL, a reduction time necessary for the output voltage Vout to decrease from the target voltage V1 to the threshold voltage Vth is given as follows: $CL \cdot \Delta V/IL$, where $\Delta V$ represents a difference between the target voltage V1 and the threshold voltage Vth.

As described above, since the capacitance and the load current vary over their respective ranges, there is a possibility that the normal condition may be incorrectly determined as the abnormal conditions. To prevent such a determination error, the time period ΔT is calculated by multiplying the reduction time by a positive coefficient K less than one. That is, the time period ΔT is given as follows: $K \cdot (CL \cdot \Delta V/IL)$. The coefficient K is a margin and can be adjusted according to the actual variations.

As described above, according to the first embodiment, the output voltage Vout remains at or above the middle voltage V2 while the determination circuit 14 performs the self-check procedure to determine a presence or absence of an abnormality in the capacitance of the capacitor and the load current. Thus, even when the output voltage Vout decreases suddenly, the MOS transistor 8 formed in the IC can be prevented from being latched up.

Further, even when the output voltage Vout decreases suddenly, the monitor circuit 13 can output the voltage reduction signal POR correctly in accordance with the output voltage Vout by setting a minimum operation voltage of the monitor circuit 13 to a value not larger than the middle voltage V2. Thus, the determination circuit 14 can surely perform the self-check procedure. Further, when the capacitance or the load current is abnormal, register values and data values can be surely saved using the voltage reduction signal POR which changes to the high level as a result of the self-check procedure.

Second Embodiment

A power supply circuit 21 according to a second embodiment of the present disclosure is described with reference to FIG. 3 and FIGS. 4A and 4B. The power supply circuit 21 shown in FIG. 3 differs from the power supply circuit 1 shown in FIG. 1 in that the power supply circuit 21 has a change circuit 22 to change the reference voltage instead of the change circuit 12 to change the voltage divisional ratio. A voltage detection circuit 23 is configured as a series circuit of resistors 23a and 23b. A junction between the resistors 23a and 23b is connected directly to the non-inverting input terminal of the operational amplifier 11. A reference voltage generation circuit 24 includes a reference voltage source 10 and resistors 24a, 24b, and 24c to generate a new reference voltage Vref by dividing a reference voltage of the reference voltage source 10 in a predetermined divisional ratio.

The change circuit 22 includes switches 22a and 22b. The switch 22a is connected between a junction between the resistors 24b and 24b and the non-inverting input terminal of the operational amplifier 11. The switch 22b is connected between a junction between the resistors 24b and 24c and the non-inverting input terminal of the operational amplifier 11. The switches 22a and 22b are complementarily turned ON and OFF. When the switch signal φD outputted from the determination circuit 14 is at the high level, the switch 22a is turned ON, and the switch 22b is turned OFF. In contrast, when the switch signal φD is at the low level, the switch 22a is turned OFF, and the switch 22b is turned ON.

FIGS. 4A and 4B correspond to FIGS. 2A and 2B, respectively. The determination circuit 14 keeps the switch signal φD at the high level when not performing the self-check procedure. At this time, the operational amplifier 11 controls the gate voltage so that the output voltage Vout can be equal to the target voltage V1. When the determination circuit 14 changes the switch signal φD from the high level to the low level and keeps the switch signal φD at the low level only for the time period ΔT, the operational amplifier 11 controls the gate voltage so that the output voltage Vout can be equal to the middle voltage V2. Thus, the same effects and advantages as obtained in the first embodiment can be obtained in the second embodiment.

Third Embodiment

Figure 5:
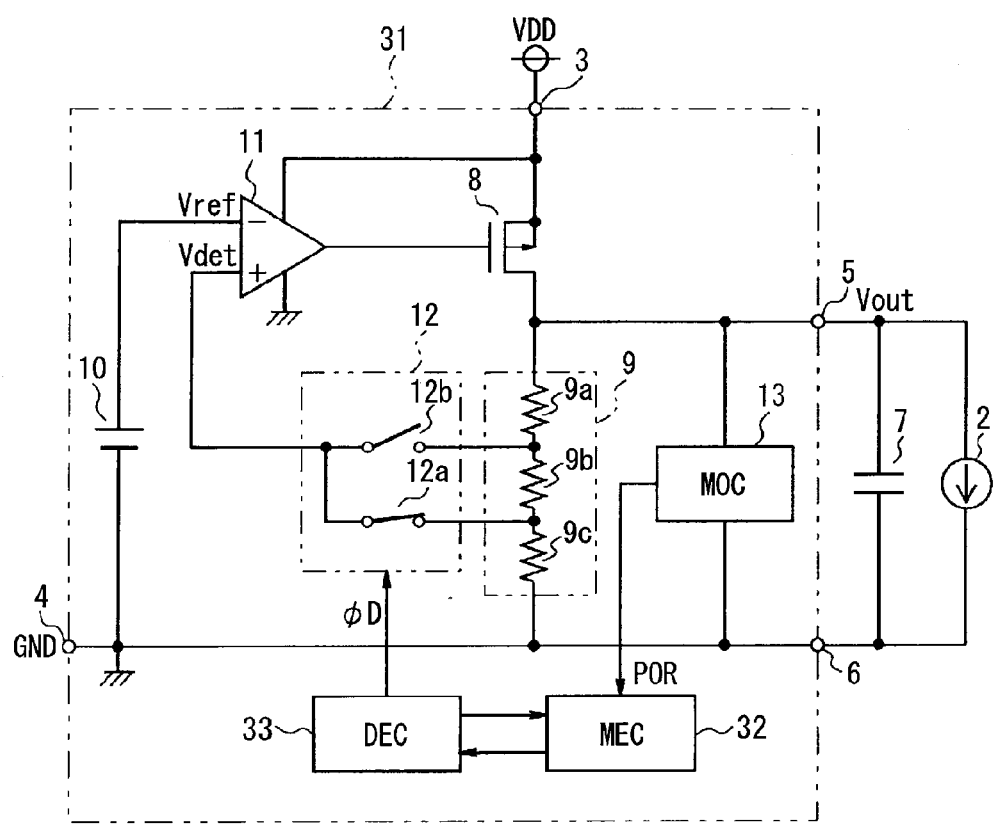
FIG. 5 is a diagram illustrating a power supply circuit according to a third embodiment of the present disclosure.

A power supply circuit 31 according to a third embodiment of the present disclosure is described with reference to FIG. 5 and FIGS. 6A and 6B. The power supply circuit 31 shown in FIG. 5 differs from the power supply circuit 1 shown in FIG. 1 in that the power supply circuit 31 has a determination circuit 33 instead of the determination circuit 14 and further includes a measurement circuit 32. The measurement circuit 32 measures time elapsed from when the determination circuit 33 changes the switch signal ϕD from the high level to the low level to start the self-check procedure to when the voltage reduction signal POR changes to the high level.

The determination circuit 33 starts the self-check procedure when the output voltage Vout is stabilized to the target voltage V1. As shown in FIGS. 6A and 6B, the determination circuit 33 changes the switch signal ϕD from the high level to the low level. Accordingly, the MOS transistor 8 is kept OFF, and the output voltage Vout decreases toward the middle voltage V2. FIGS. 6A and 6B correspond to FIGS. 2A and 2B, respectively.

As described in the first embodiment, in the normal condition where the capacitance of the capacitor 7 is equal to the predetermined value CL and that the load current is equal to the predetermined value IL, it take the reduction time CL·ΔV/IL for the output voltage Vout to decrease from the target voltage V1 to the threshold voltage Vth. In contrast, in the abnormal conditions such as when the capacitor 7 is not connected between the output nodes 5 and 6, when the capacitance of the capacitor 7 is extremely smaller than the predetermined value CL, and when the load current is extremely larger than the predetermined value IL, the output voltage Vout decreases from the target voltage V1 to the threshold voltage Vth before the reduction time CL·ΔV/IL elapses.

Based on the above analysis, when the time measured by the measurement circuit 32 is smaller than a threshold time ΔT=K·(CL·ΔV/IL), the determination circuit 33 determines that the capacitance or the load current is abnormal. Since the capacitance and the load current vary over their respective ranges, there is a possibility that the normal condition may be incorrectly determined as the abnormal conditions. To prevent such a determination error, the threshold time ΔT is calculated by multiplying the reduction time by a positive coefficient K less than one.

According to the third embodiment, the output voltage Vout remains at or above the middle voltage V2 while the determination circuit 14 performs the self-check procedure. Thus, the same effects and advantages as obtained in the first embodiment can be obtained in the third embodiment.

Fourth Embodiment

Figure 7:
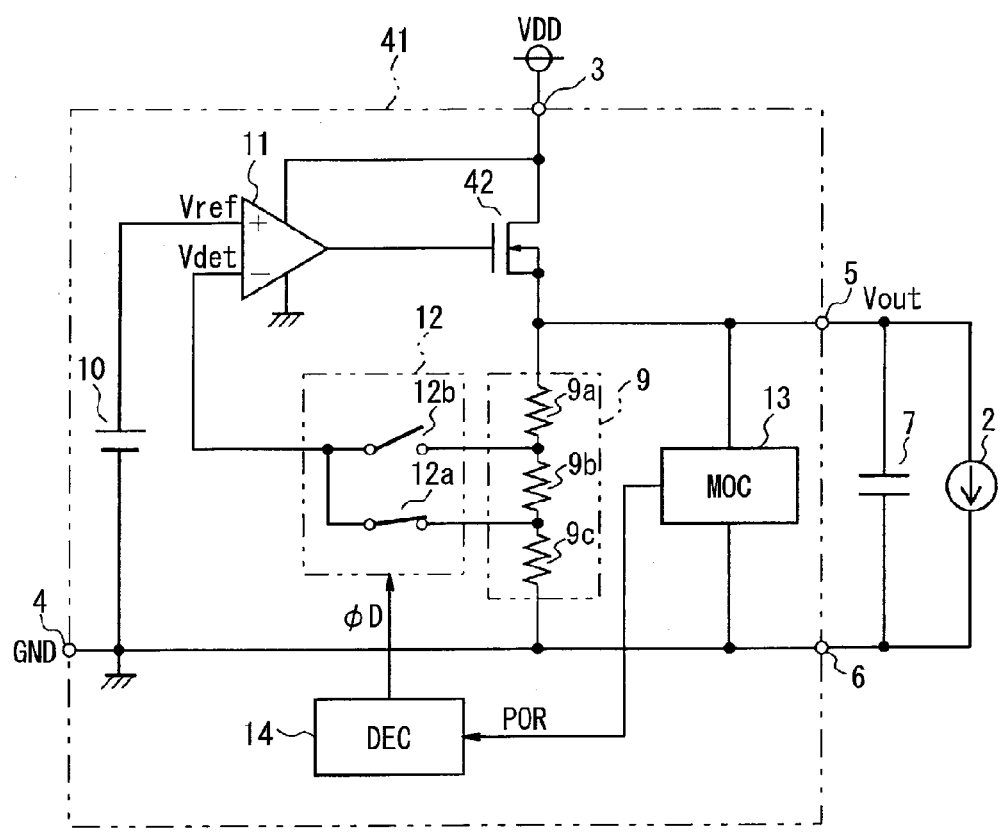
FIG. 7 is a diagram illustrating a power supply circuit according to a fourth embodiment of the present disclosure.

A power supply circuit 41 according to a fourth embodiment of the present disclosure is described with reference to FIG. 7. The power supply circuit 41 shown in FIG. 7 differs from the power supply circuit 1 shown in FIG. 1 in that the power supply circuit 41 has a N-channel MOS transistor 42 instead of the P-channel MOS transistor 8. Even in this configuration, the same effects and advantages as obtained in the first embodiment can be obtained.

Fifth Embodiment

Figure 8:
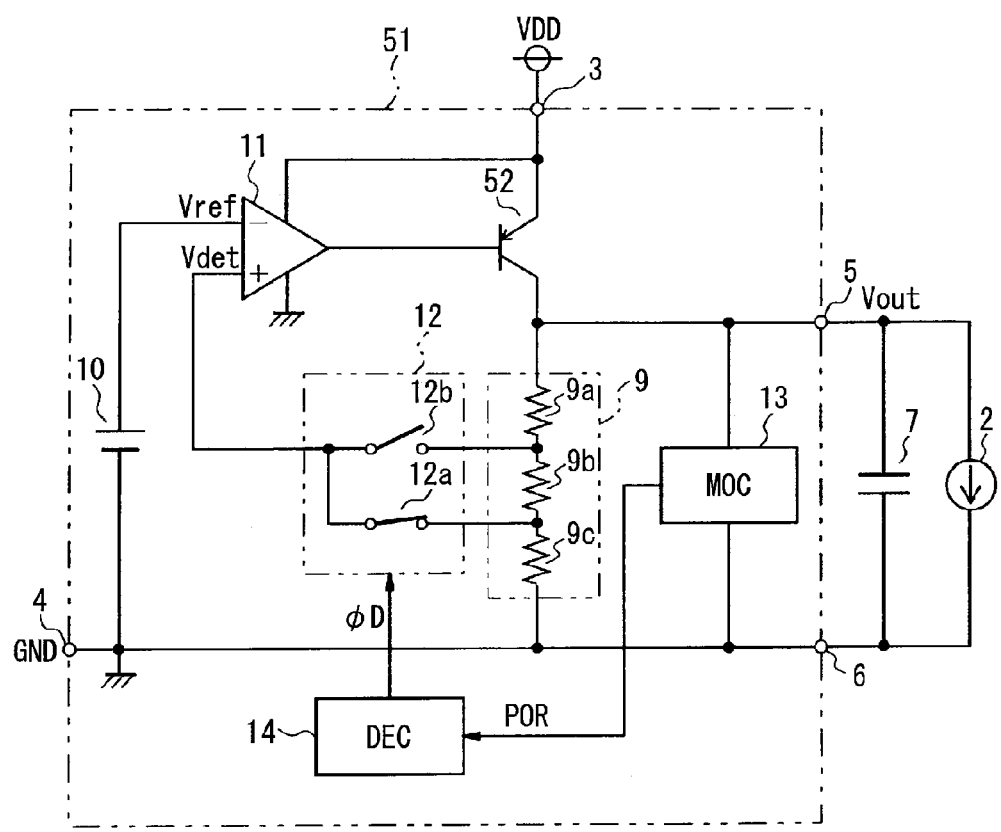
FIG. 8 is a diagram illustrating a power supply circuit according to a fifth embodiment of the present disclosure.

A power supply circuit 51 according to a fifth embodiment of the present disclosure is described with reference to FIG. 8. The power supply circuit 51 shown in FIG. 8 differs from the power supply circuit 1 shown in FIG. 1 in that the power supply circuit 51 has a PNP transistor 52 instead of the P-channel MOS transistor 8. Even in this configuration, the same effects and advantages as obtained in the first embodiment can be obtained.

Sixth Embodiment

Figure 9:
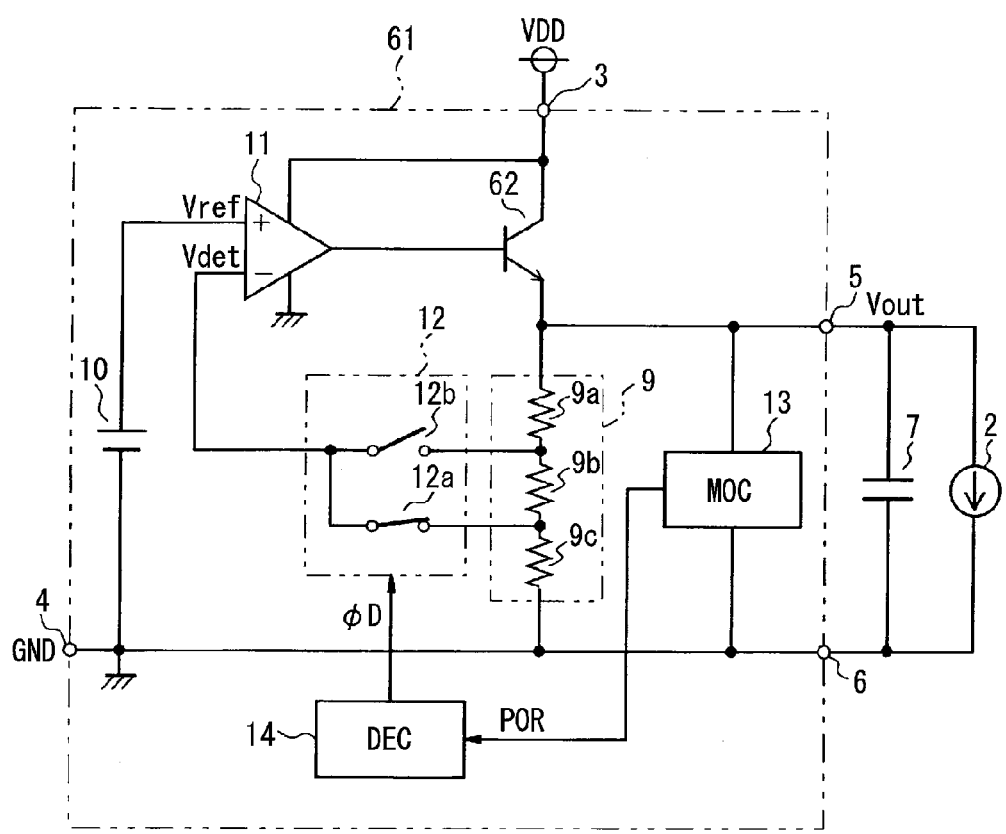
FIG. 9 is a diagram illustrating a power supply circuit according to a sixth embodiment of the present disclosure.

A power supply circuit 61 according to a sixth embodiment of the present disclosure is described with reference to FIG. 9. The power supply circuit 61 shown in FIG. 9 differs from the power supply circuit 1 shown in FIG. 1 in that the power supply circuit 61 has an NPN transistor 62 instead of the P-channel MOS transistor 8. Even in this configuration, the same effects and advantages as obtained in the first embodiment can be obtained.

Modifications

While the present disclosure has been described with reference to the embodiment, it is to be understood that the disclosure is not limited to the embodiment. The present disclosure is intended to cover various modifications and equivalent arrangements within the spirit and scope of the present disclosure.

In the third to sixth embodiments, the voltage detection circuit 9 and the change circuit 12 can be replaced with the reference voltage generation circuit 24 and the change circuit 22.

Figure 3:
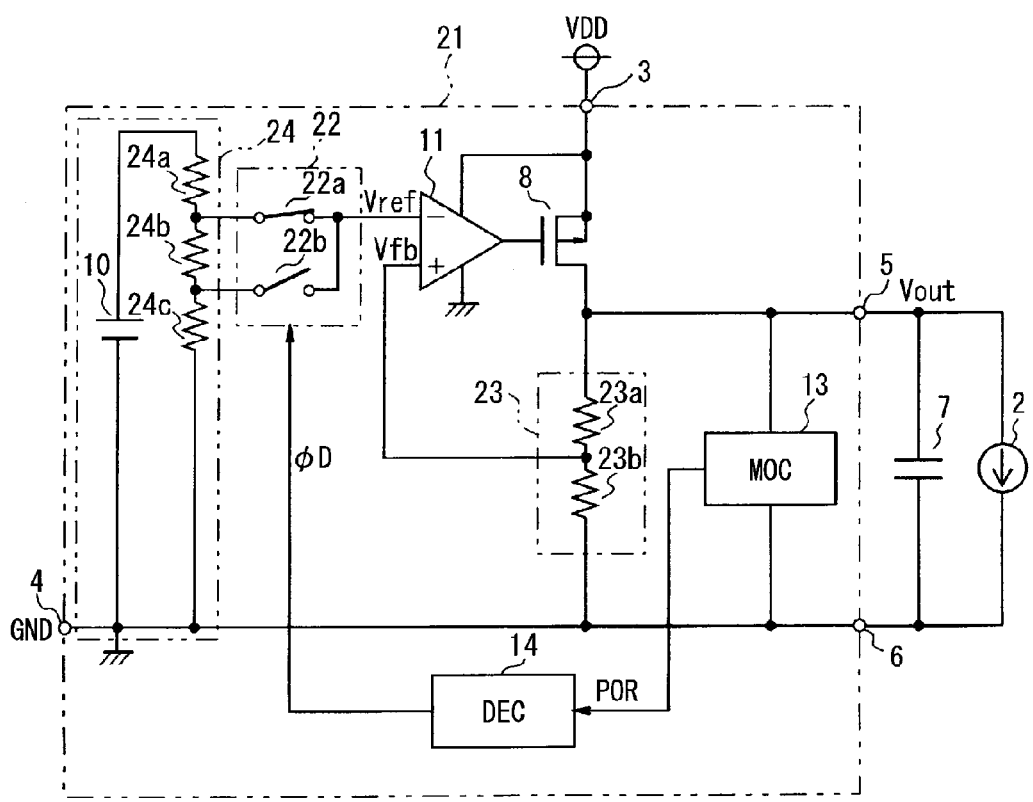
FIG. 3 is a diagram illustrating a power supply circuit according to a second embodiment of the present disclosure.

In the embodiments and modifications, the voltage detection circuit 9 and the change circuit 12 shown in FIG. 1 can be used in combination with the reference voltage generation circuit 24 and the change circuit 22 shown in FIG. 3 by supplying the change command to both the change circuits 12 and 22.

Besides a series regulator, the present disclosure can be applied to a chopper circuit or the like.

Such changes and modifications are to be understood as being within the scope of the present invention as defined by the appended claims.

What is claimed is:
1. A power supply apparatus comprising:
an input terminal adapted to be connected to an input power source;
an output terminal adapted to be connected to a load;
a power transmission circuit configured to transmit electric power in a direction from the input terminal to the output terminal and capable of adjusting the transmitted power;
a detection circuit configured to detect an output voltage of the output terminal in a predetermined detection ratio;
a reference voltage generation circuit configured to generate a reference voltage;
a control circuit configured to control the transmitted electric power so that the voltage detected by the detection circuit can be equal to the reference voltage;
a monitor circuit, to which the output voltage is applied, configured to output a voltage reduction signal when the output voltage decreases below a predetermined threshold voltage;
a change circuit configured to change at least one of the detection ratio and the reference voltage so that the output voltage can transition between a target voltage higher than the threshold voltage and a middle voltage lower than the threshold voltage, the middle voltage being larger than a minimum operation voltage of the monitor circuit; and a determination circuit configured to perform an abnormality determination process, when the output voltage is equal to the target voltage, by supplying a change command to the change circuit, wherein the change circuit changes at least one of the detection ratio and the reference voltage in response to the change command so that the output voltage can transition from the target voltage toward the middle voltage only during a predetermined time period, when the output voltage is decreased to the middle voltage during the abnormality determination process, the control circuit controls the power transmission circuit so that the output voltage remains at or above the middle voltage thereby preventing the output voltage from decreasing below the minimum operation voltage of the monitor circuit, when the monitor circuit outputs the voltage reduction signal in the abnormality determination process, the determination circuit determines that a capacitance connected to the output terminal or a load current flowing through the load is abnormal, the predetermined time period is given by $K \cdot (CL \cdot \Delta V/IL)$, K is a positive coefficient less than one, CL is a predetermined value of the capacitance, IL is a predetermined value of the load current, and $\Delta V$ is a difference between the target voltage and the threshold voltage.

2. A power supply apparatus comprising:

an input terminal adapted to be connected to an input power source;

an output terminal adapted to be connected to a load;

a power transmission circuit configured to transmit electric power in a direction from the input terminal to the output terminal and capable of adjusting the transmitted power;

a detection circuit configured to detect an output voltage of the output terminal in a predetermined detection ratio;

a reference voltage generation circuit configured to generate a reference voltage;

a control circuit configured to control the transmitted electric power so that the voltage detected by the detection circuit can be equal to the reference voltage;

a monitor circuit, to which the output voltage is applied, configured to output a voltage reduction signal when the output voltage decreases below a predetermined threshold voltage;

a change circuit configured to change at least one of the detection ratio and the reference voltage so that the output voltage can transition between a target voltage higher than the threshold voltage and a middle voltage lower than the threshold voltage, the middle voltage being larger than a minimum operation voltage of the monitor circuit;

a determination circuit configured to perform an abnormality determination process, when the output voltage is equal to the target voltage, by supplying a change command to the change circuit, and a measurement circuit configured to measure a time elapsed from when the determination circuit supplies the change command to the change circuit to when the monitor circuit outputs the voltage reduction signal, wherein the change circuit changes at least one of the detection ratio and the reference voltage in response to the change command so that the output voltage can transition from the target voltage toward the middle voltage, when the output voltage is decreased to the middle voltage during the abnormality determination process, the control circuit controls the power transmission circuit so that the output voltage remains at or above the middle voltage thereby preventing the output voltage from decreasing below the minimum operation voltage of the monitor circuit, when the time measured by the measurement circuit is less than a predetermined time period, the determination circuit determines that a capacitance connected to the output terminal or a load current flowing through the load is abnormal, the time period is given by $K \cdot (CL \cdot \Delta V/IL)$, K is a positive coefficient less than one, CL is a predetermined value of the capacitance, IL is a predetermined value of the load current, and $\Delta V$ is a difference between the target voltage and the threshold voltage.

3. The power supply apparatus according to claim 1, wherein:

after an elapse of the predetermined time period since supply of the change command from the determination circuit, the determination circuit changes the output voltage back to the target voltage.

4. The power supply apparatus according to claim 1, wherein:

the determination circuit performs the abnormality determination process to determine a presence or absence of abnormality in the capacitance or the load current, the abnormality being a difference of the capacitance from the predetermined value of the capacitance or a difference of the load current from the predetermined value of the load current.

5. The power supply apparatus according to claim 2, wherein:

the determination circuit performs the abnormality determination process to determine a presence or absence of abnormality in the capacitance or the load current, the abnormality being associated with a difference of the capacitance from the predetermined value of the capacitance or a difference of the load current from the predetermined value of the load current.

* * * * *